(12) United States Patent
Hsieh et al.

(10) Patent No.: US 8,054,077 B2
(45) Date of Patent: Nov. 8, 2011

(54) FERROMAGNETIC FRAME MAGNET WITH SUPERCONDUCTING COILS

(75) Inventors: Hank Hsieh, Berkeley, CA (US); Gordon T. Danby, Wading River, NY (US); Raymond V. Damadian, Woodbury, NY (US); John W. Jackson, Shoreham, NY (US); Hugh J. Wahl, Stonybrook, NY (US); Cristian Balica, Middle Village, NY (US)

(73) Assignee: Fonar Corporation, Melville, NY (US)

( * ) Notice: Subject to any disclaimer, the term of this patent is extended or adjusted under 35 U.S.C. 154(b) by 62 days.

(21) Appl. No.: 12/486,147

(22) Filed: Jun. 17, 2009

(65) Prior Publication Data

US 2009/0256663 A1 Oct. 15, 2009

Related U.S. Application Data

(62) Division of application No. 11/504,246, filed on Aug. 14, 2006, now Pat. No. 7,560,929.

(51) Int. Cl.
*G01V 3/00* (2006.01)
(52) U.S. Cl. ...................................... 324/307; 324/309
(58) Field of Classification Search .......... 324/300–322; 600/407–445
See application file for complete search history.

(56) References Cited

U.S. PATENT DOCUMENTS

| | | | |
|---|---|---|---|
| 4,721,934 A | 1/1988 | Stacy | |
| 4,766,378 A | 8/1988 | Danby et al. | |
| 4,822,772 A | 4/1989 | Huson | |
| 4,902,995 A | 2/1990 | Vermilyea | |
| 4,968,961 A | 11/1990 | Miyajima et al. | |
| 4,986,078 A | 1/1991 | Laskaris | |
| 5,250,901 A | 10/1993 | Kaufman et al. | |
| 5,309,106 A | 5/1994 | Miyajima et al. | |
| 5,381,122 A | 1/1995 | Laskaris et al. | |
| 5,412,363 A | 5/1995 | Breneman et al. | |
| 5,446,433 A | 8/1995 | Laskaris et al. | |
| 5,532,663 A | 7/1996 | Herd et al. | |
| 5,581,223 A | 12/1996 | Ono et al. | |
| 5,874,880 A | 2/1999 | Laskaris et al. | |
| 5,874,882 A | 2/1999 | Laskaris et al. | |
| 5,883,558 A | 3/1999 | Laskaris et al. | |
| 5,982,260 A | 11/1999 | Byrne | |
| 5,994,991 A | 11/1999 | Laskaris et al. | |
| 6,014,070 A | 1/2000 | Danby et al. | |
| RE36,782 E | 7/2000 | Brown et al. | |

(Continued)

OTHER PUBLICATIONS

International Search Report, PCT/US2007/18031.

(Continued)

*Primary Examiner* — Brij Shrivastav
(74) *Attorney, Agent, or Firm* — Lerner, David, Littenberg, Krumholz & Mentlik, LLP

(57) ABSTRACT

A magnetic resonance imaging magnet includes a ferromagnetic frame. A pair of generally toroidal superconducting coil units overlie interfaces of side walls incorporated in the frame. Each coil unit may include a vessel having hollow support extensions extending into recesses in the side walls. The coil units may further include elongated, low-thermal conductance supports disposed within the support extensions. The frame may include pole stems projecting inwardly from the side walls, and the coils may be disposed in close proximity to the pole stems. Cryocoolers may be mounted to the frame so that the cryocoolers are substantially mechanically isolated from the coils of the coil units, but are in thermal communication therewith. The cryocooler mountings may be arranged for convenient servicing and installation of the cryocoolers.

13 Claims, 8 Drawing Sheets

U.S. PATENT DOCUMENTS

| | | | |
|---|---|---|---|
| 6,150,912 | A | 11/2000 | Elgin, II et al. |
| 6,166,617 | A | 12/2000 | Laskaris et al. |
| 6,201,462 | B1 | 3/2001 | Laskaris et al. |
| 6,246,308 | B1 | 6/2001 | Laskaris et al. |
| 6,323,749 | B1 | 11/2001 | Hsieh |
| 6,507,259 | B2 | 1/2003 | Westphal et al. |
| 6,570,475 | B1 | 5/2003 | Lvovsky et al. |
| 6,570,476 | B1 | 5/2003 | Laskaris |
| 6,580,346 | B1 | 6/2003 | Takeshima et al. |
| 6,664,876 | B2 | 12/2003 | Watanabe et al. |
| 6,667,676 | B2 | 12/2003 | Watanabe et al. |
| 6,677,753 | B1 | 1/2004 | Danby et al. |
| 6,816,051 | B2 | 11/2004 | Watanabe et al. |
| 6,933,817 | B2 | 8/2005 | Reeves et al. |
| 7,170,377 | B2 * | 1/2007 | Jiang et al. .................... 335/216 |
| 7,327,863 | B1 | 2/2008 | Green et al. |
| 7,375,521 | B1 | 5/2008 | Damadian et al. |
| 7,397,244 | B2 * | 7/2008 | Cirel ............................. 324/318 |
| 7,489,131 | B2 * | 2/2009 | Lvovsky ....................... 324/307 |
| 7,528,605 | B2 * | 5/2009 | Chiba et al. .................. 324/318 |
| 7,560,929 | B2 * | 7/2009 | Hsieh et al. .................. 324/318 |
| 7,714,574 | B2 * | 5/2010 | Ando et al. ................... 324/309 |
| 7,928,820 | B2 * | 4/2011 | Chiba et al. .................. 335/216 |
| 2006/0022779 | A1 | 2/2006 | Jiang et al. |
| 2008/0022698 | A1 | 1/2008 | Hobbs et al. |
| 2010/0041976 | A1 * | 2/2010 | Gore et al. ................... 600/410 |

OTHER PUBLICATIONS

Schenck, John, M.D., Ph.D, et al., "Superconducting Open-Configuration MR Imaging System for Image-guided Therapy," Interventional Radiology, Jun. 1995, pp. 805.

* cited by examiner

FERROMAGNETIC FRAME MAGNET WITH SUPERCONDUCTING COILS

CROSS-REFERENCE TO RELATED APPLICATIONS

The present application is a divisional of U.S. patent application Ser. No. 11/504,246, filed Aug. 14, 2006, the disclosure of which is incorporated by reference herein.

FIELD OF THE INVENTION

The present invention relates to magnets for magnetic resonance imaging apparatus, and to magnetic resonance imaging apparatus incorporating such magnets.

BACKGROUND OF THE INVENTION

In magnetic resonance imaging, the body of a subject is positioned in a primary field magnet and subjected to a strong, constant magnetic field. Radio frequency signals are applied to the subject, which causes the spin axes of certain atomic nuclei within the body of the subject to precess or rotate around axes parallel to the direction of the magnetic field. The precessing nuclei emit weak radio frequency signals referred to herein as magnetic resonance signals.

By applying small magnetic field gradients to the subject along with the static magnetic field, the magnetic resonance signals can be spatially encoded so that it is possible to recover information about individual volume elements or "voxels" within the subject's body from the magnetic resonance signals. The information can be used to reconstruct an image of the internal structures within the body. Because magnetic resonance imaging does not use ionizing radiation, it is inherently safe. Moreover, magnetic resonance imaging can provide excellent images depicting structures which are difficult to image using other modalities.

The quality of a magnetic resonance image depends strongly on the quality of the static magnetic field. To provide an optimum image, the static magnetic field must be both strong (typically on the order of 0.5 Tesla or more) and uniform to about 1 part in a million or better, desirably about 1 part in $10^7$ or better. Some magnetic resonance imaging instruments employ air core superconducting static field magnets. These magnets typically have electromagnet coils formed from superconducting materials arrayed along an axis so that the coils cooperatively form an elongated solenoid surrounding the axis. The coils are cooled to cryogenic temperatures, typically about 4.2° Kelvin (approximately −267° C. or −450° F.). At these temperatures, the coils have no electrical resistance. The superconducting coils can conduct large currents and provide a strong magnetic field.

Magnets of this type typically have a housing defining an elongated bore extending along the axis and require that the patient enter into this bore. The bore may be about 1 meter in diameter. Thus, the patient is subjected to a highly claustrophobic experience during imaging, akin to lying on a stretcher inside a drain pipe. Moreover, these magnets cannot be used to image patients who are extremely obese, or who require bulky life support equipment during imaging. Additionally, air core magnets have strong fringe fields extending outside of the magnet housing. These fields can attract ferromagnetic objects in the vicinity of the magnets with such strength that the objects turn into deadly missiles. Despite stringent precautions taken by imaging centers to prevent entry of ferromagnetic objects into the danger zone surrounding a magnet, accidents have occurred resulting in injuries and deaths.

Iron core magnets use a ferromagnetic frame defining a flux path and usually include ferromagnetic poles projecting towards a patient-receiving space from opposite sides, so that the pole tips define the patient-receiving space between them. The ferromagnetic frame effectively eliminates the fringe field outside of the frame. Moreover, the ferromagnetic frame serves to concentrate the field within the patient-receiving space and provides a low-reluctance flux path. Ferromagnetic frame magnets can provide the requisite field strength using essentially any source of magnetic flux, including superconducting coils, resistive coils, or masses of permanent magnet material.

One particularly desirably ferromagnetic frame magnet is disclosed in commonly owned U.S. Pat. No. 6,677,753, the disclosure of which is hereby incorporated by reference herein. As disclosed in preferred embodiments of the '753 patent, the frame includes ferromagnetic side walls extending generally vertically and flux return structures extending generally horizontally above and below the patient-receiving space. Poles project from the side walls toward the patient-receiving space. As described in greater detail in the '753 patent, a patient may be positioned within the patient-receiving space in essentially any orientation relative to gravity, and may be moved relative to the frame so as to position essentially any part of the patient's body within the patient-receiving space, in the vicinity of the magnet axis extending between the poles.

Preferred magnets according to this general structure can provide extraordinary imaging versatility. For example, a patient may be imaged lying in a recumbent, substantially horizontal position and then imaged again while in a substantially vertical position such as standing or sitting. Comparison of these images can yield significant information about certain conditions. Also, these magnets provide an open environment for the patient.

As mentioned above, a ferromagnetic frame magnet can use any source of magnetic flux, including superconducting coils. A magnet using superconducting coils in conjunction with the ferromagnetic frame can provide very high field strength with good uniformity. U.S. Pat. Nos. 6,323,749 and 4,766,378, for example, disclose certain arrangements for mounting superconducting coils on ferromagnetic frame magnets.

Despite all of this progress in the art, still further improvement would be desirable. As mentioned above, superconducting coils must be maintained at cryogenic temperatures, typically at the temperature of liquid helium (about 4.2° Kelvin or below). Typically, the coils are provided with refrigeration units referred to herein as cryocoolers, which can abstract heat from the coil and from associated components even at this very low temperature. However, the cryocoolers have only a very limited capacity, typically on the order of a few watts or less at this temperature. Therefore, the coils must be surrounded by very efficient thermal insulation. Most commonly, the coils are enclosed in vessels which are maintained under hard vacuum. The coils must be supported and held in place within the vessels. The structures hold the coil must resist not only the weight of the coil but also the magnetic forces generated during operation. Depending on the particular coil design and the design of any adjacent ferromagnetic frame elements, these forces can be on the order of tons. The coil vessel and supporting structure should be compact so as to minimize the size and weight of the apparatus. Design of a compact coil enclosure and supporting system has presented a challenge heretofore.

Cryocoolers typically induce mechanical vibrations. Transmission of such vibrations to the coils and associated structures tends to degrade the uniformity and stability of the static magnetic field. However, it is generally desirable to position portions of the cryocooler in proximity to the coil enclosure. This further complicates design of such a system. Additionally, the superconducting coils used heretofore typically have not been arranged for optimum co-action with the ferromagnetic frame. Thus, further improvement would be desirable.

SUMMARY OF THE INVENTION

One aspect of the present invention provides a magnetic resonance imaging magnet. The magnet according to this aspect of the invention desirably includes a ferromagnetic frame having a pair of generally vertical side walls spaced apart from one another, each side wall having an inner face facing in an inward direction toward the other side wall. The frame preferably includes ferromagnetic flux return members extending between the side walls. The frame has an axis extending between the side walls. Most desirably, each side wall has an array of recesses surrounding the axis, each such recess extending into the side wall from the inner face thereof. The magnet according to this aspect of the invention desirably also includes a pair of superconducting coil units overlying the inner faces of the side walls. Each coil unit preferably includes a coil of a superconducting material substantially coaxial with the axis and a generally toroidal vacuum vessel which is also coaxial with the axis. The vessel desirably has hollow support extensions extending into the recesses in the frame side walls. Each coil unit most preferably further includes elongated coil supports disposed within the support extensions.

As further discussed below, the elongated supports bear the magnetic forces applied to the coil in operation, but provide substantial resistance to heat transmission into the coil from the environment. Positioning the support extensions and elongated supports within the recesses of the side walls allows placement of the coils in close proximity to the side walls, resulting in a compact structure. Most preferably, the ferromagnetic frame includes ferromagnetic poles projecting from the inner faces of the side walls along the axis, and the coil units are configured so that the coils are in close proximity to the poles. The coils have good magnetic coupling to the frame, and can provide a strong, uniform field with a reasonable number of ampere-turns.

A further aspect of the invention provides a magnetic resonance imaging magnet which also includes a ferromagnetic frame having a pair of generally vertical side walls spaced apart from one another and flux return members extending between said sidewalls. Here again, the magnet desirably includes a pair of superconducting coil units overlying the inner faces of the side walls, each coil unit including a coil of a superconducting material substantially coaxial with said axis and a vacuum vessel surrounding the coil. The magnet according to this aspect of the invention most preferably includes at least one cryocooler mounted to the frame in thermal communication with the coil units but substantially mechanically isolated from the coils of the coil units. Most preferably, the magnet includes two cryocoolers which are mechanically mounted to the ferromagnetic frame. In one arrangement, the coil units include service port chambers associated with the vacuum vessels, and the service port chambers are disposed above the axis. The cryocoolers are thermally connected to the coil units through the service port chambers. Where the frame includes poles projecting inwardly along the axis and flux return members, the service port chambers may be disposed in a space between upper flux return members, above the poles, so that the service port chambers do not add appreciably to the size of the magnet and do not obstruct patient positioning in the magnet.

As further described below, the coil units may include thermal shields disposed between the walls of the vacuum vessels and the assembly including the actual turns of the coil, referred to herein as the "cold assembly." The cryocoolers may have first thermal extraction elements thermally connected to the thermal shields by flexible thermal conductors. The flexible thermal conductors conduct heat from the thermal shields to the cyrocoolers, but also provide mechanical isolation and also permit movement of the cryocoolers between their normal operating positions and retracted positions for servicing or replacement. Typically, a cryogen reservoir is disposed within the service port chamber of each coil unit, and each cryocooler also includes a second thermal extraction element disposed in proximity to the cryogen reservoir of the associated coil unit. The second thermal extraction element extracts heat from cryogen vapor in the reservoir, and thus serves as a condenser. The thermal extraction elements of each cryocooler typically are mounted on an elongated stem projecting into the service port chamber of the associated coil unit. The service port chamber may include an elongated, flexible tubular element such as a bellows having an interior space extending between the cryogen reservoir and the exterior of the service port, and the stem may be received in this interior space. As further discussed below, the flexible tubular element provides mechanical isolation between the cryocooler and the coil unit, and also can deform to facilitate movement of the cryocooler for service or repair.

Still further aspects of the invention provide methods of assembling magnets.

DETAILED DESCRIPTION

Figure 2:
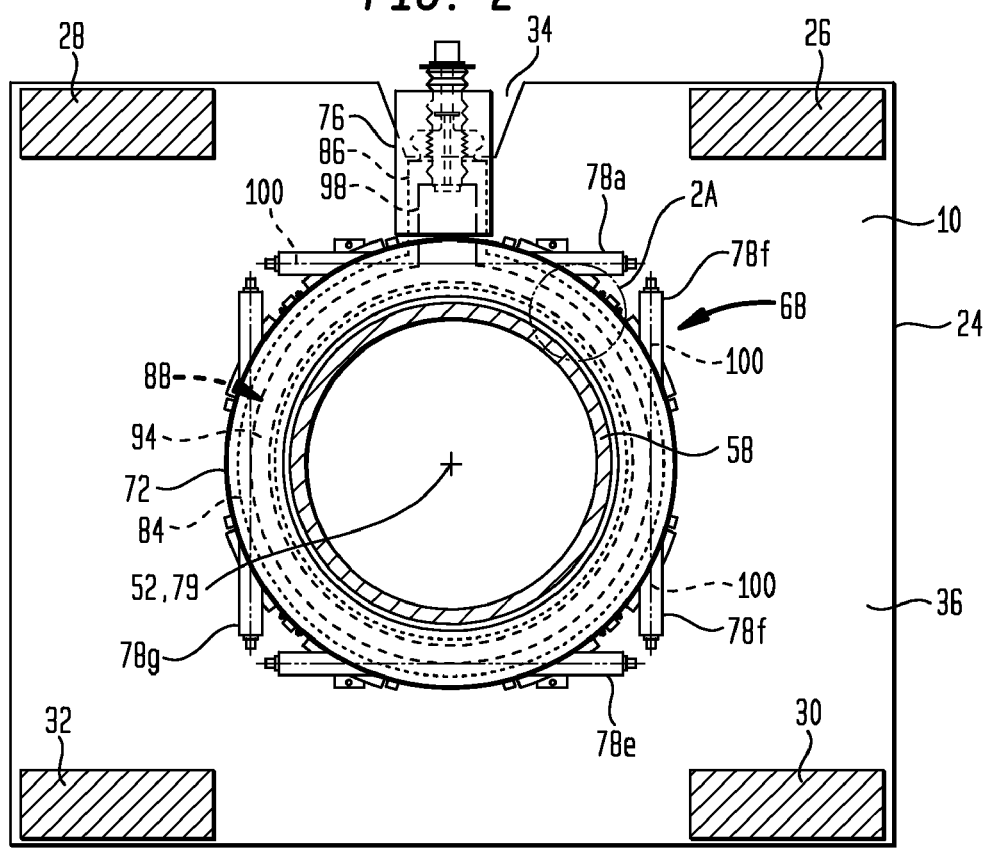
FIGS. 2 and 3 are sectional elevational views taken along lines 2 and 3 respectively in FIG. 1.
Figure 3:
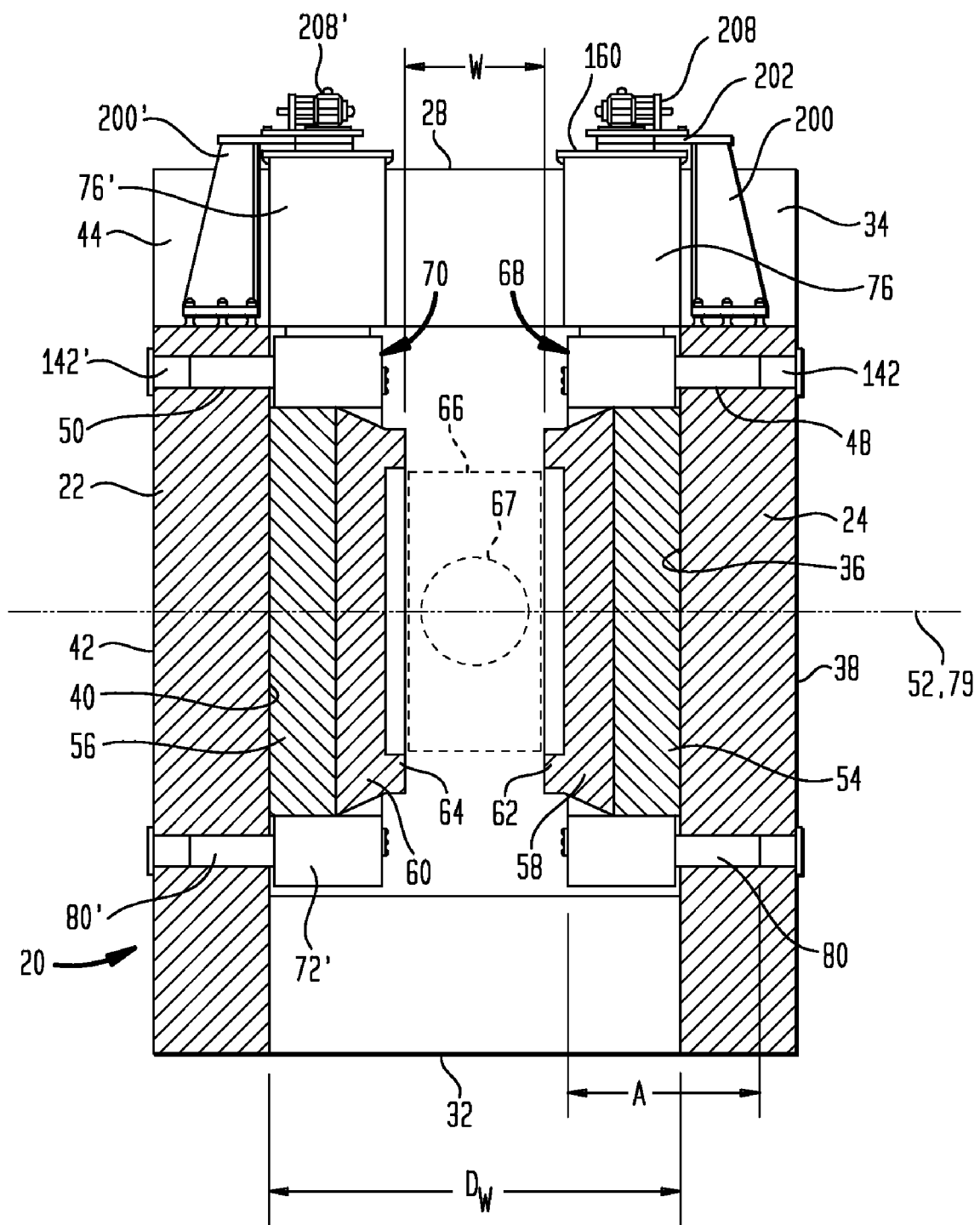

A magnet in accordance with one embodiment of the present invention includes a ferromagnetic frame or yoke 20 having a pair of generally vertical side walls 22 and 24 (FIGS. 1-3), upper flux return members 26 and 28 (FIGS. 1 and 2) extending between the side walls adjacent the top edges of the side walls, and lower flux return members 30 and 32 extending between the side walls adjacent the lower edges thereof. As best seen in FIG. 2, side wall 10 is generally rectangular, but has a notch 34 in its upper edge. Side wall 24 has an inner face 36 facing towards the opposite side wall 22 and an outer face 38. Side wall 22 has a similar inner face 40 and outer face 42 (FIGS. 1 and 3), and also has a notch 44 in its top edge. A pair of cylindrical ferromagnetic pole stems 54 and 56 project inwardly from the side walls along an axis 52. Ferromagnetic pole caps 58 and 60 overlie the ends of pole stems 54 and 56 remote from side walls 22 and 24. Pole caps 58 and 60 are generally circular in shape, as viewed along the axis (FIG. 2). As best seen in FIG. 3, the pole caps may have a generally frustoconical shape with projecting edges 62 and 64 along their peripheries. The exact shapes of the pole caps may be selected to promote a more uniform magnetic field. The pole caps cooperatively define an imaging region 66 in the form of an imaginary cylinder 66 concentric with axis 52 and disposed between the pole caps. Pole caps 58 and 60 are formed separately from pole stems 54 and 56, and are mounted to the pole stems by fasteners such as conventional ferromagnetic bolts (not shown). As further explained below, the pole caps desirably are assembled to the pole stems after mounting of certain other components during assembly of the apparatus.

Side wall 24 has recesses 48 (FIG. 3) in the form of bores extending through the side wall from inner surface 36 to outer surface 38. Side wall 20 has similar recesses or bores 50. These bores are disposed in a circular pattern around the axis 52.

Although the structure can be made in any size, one typical embodiment has pole stems approximately 64 inches (162 cm) in diameter, and has an imaging region about 56 inches (142 cm) in diameter with a width or clearance W (FIG. 3) about 22 inches (55.9 cm) between the pole caps. The field can provide useful images throughout this imaging region. However, the field has the best uniformity within a sub-region 67 closely surrounding the axis; this sub-region includes a sphere about 25 cm in diameter or larger; within this sub-region, the field is uniform to within about 1 part in $10^7$ or better.

As disclosed in U.S. Pat. No. 6,777,753, the open spaces between the side walls allow for introduction of a patient on a movable patient support. Also, the spaces between the top flux return members 26 and 28 and between the bottom flux return members 32 and 30 allow for raising or lowering the patient support, so that a portion of the patient may be positioned above or below the edges of the side walls, so as to bring any portion of the patient into alignment with axis 52.

Figure 4:
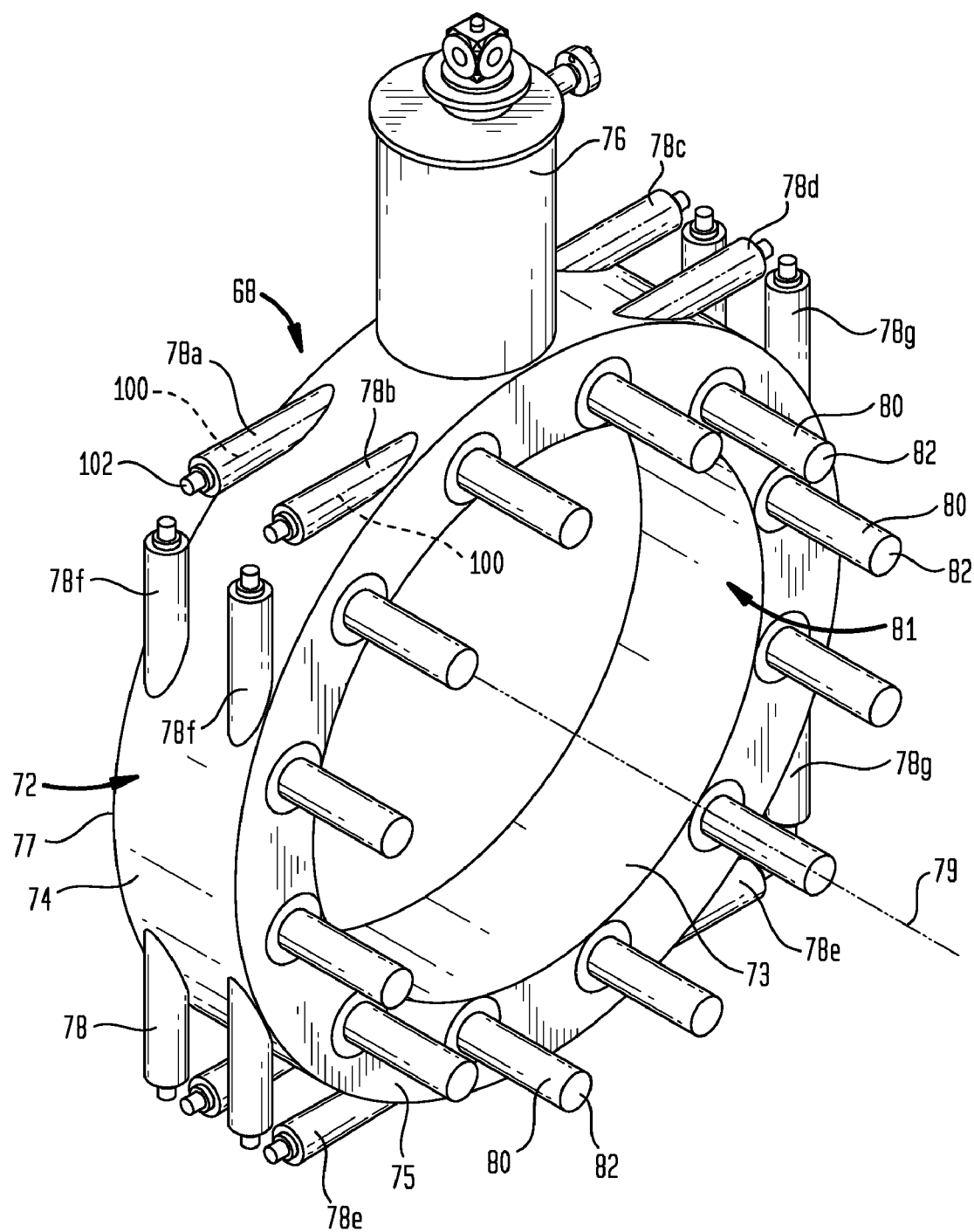
FIG. 4 is a diagrammatic perspective view of a vessel used in the embodiment of FIGS. 1-3.
Figure 5:
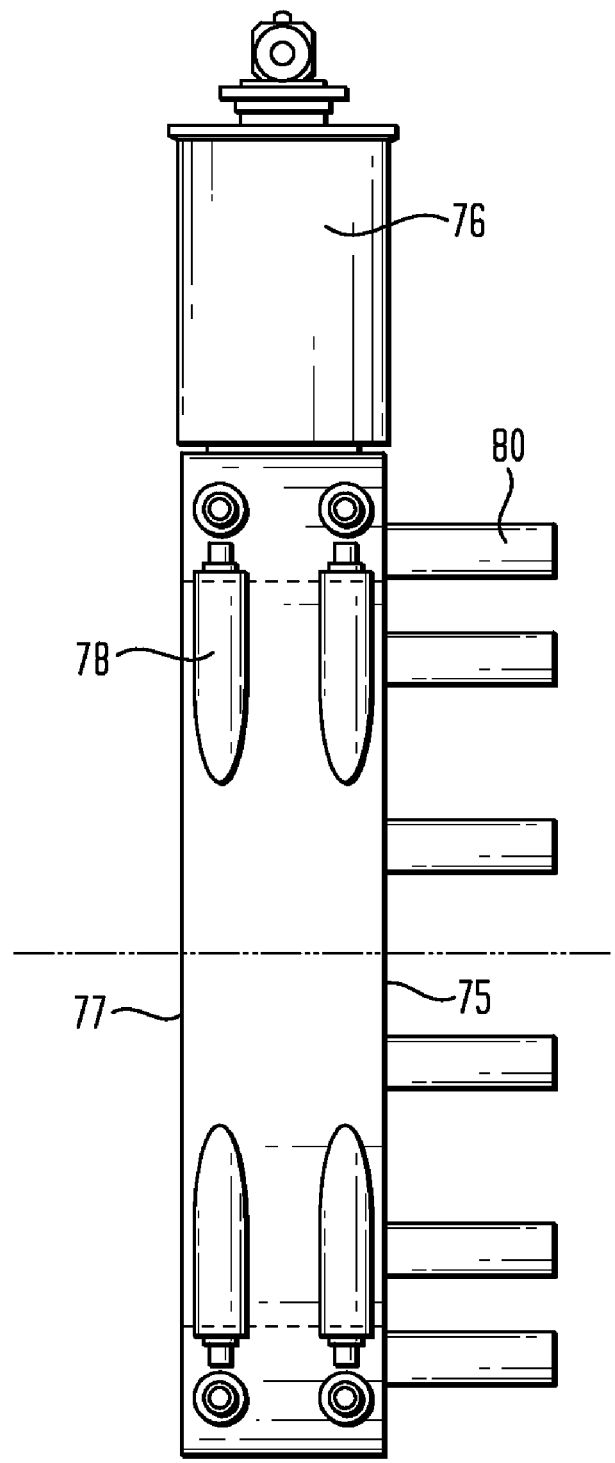
FIGS. 5 and 6 are elevational views of the vessel shown in FIG. 4.
Figure 6:
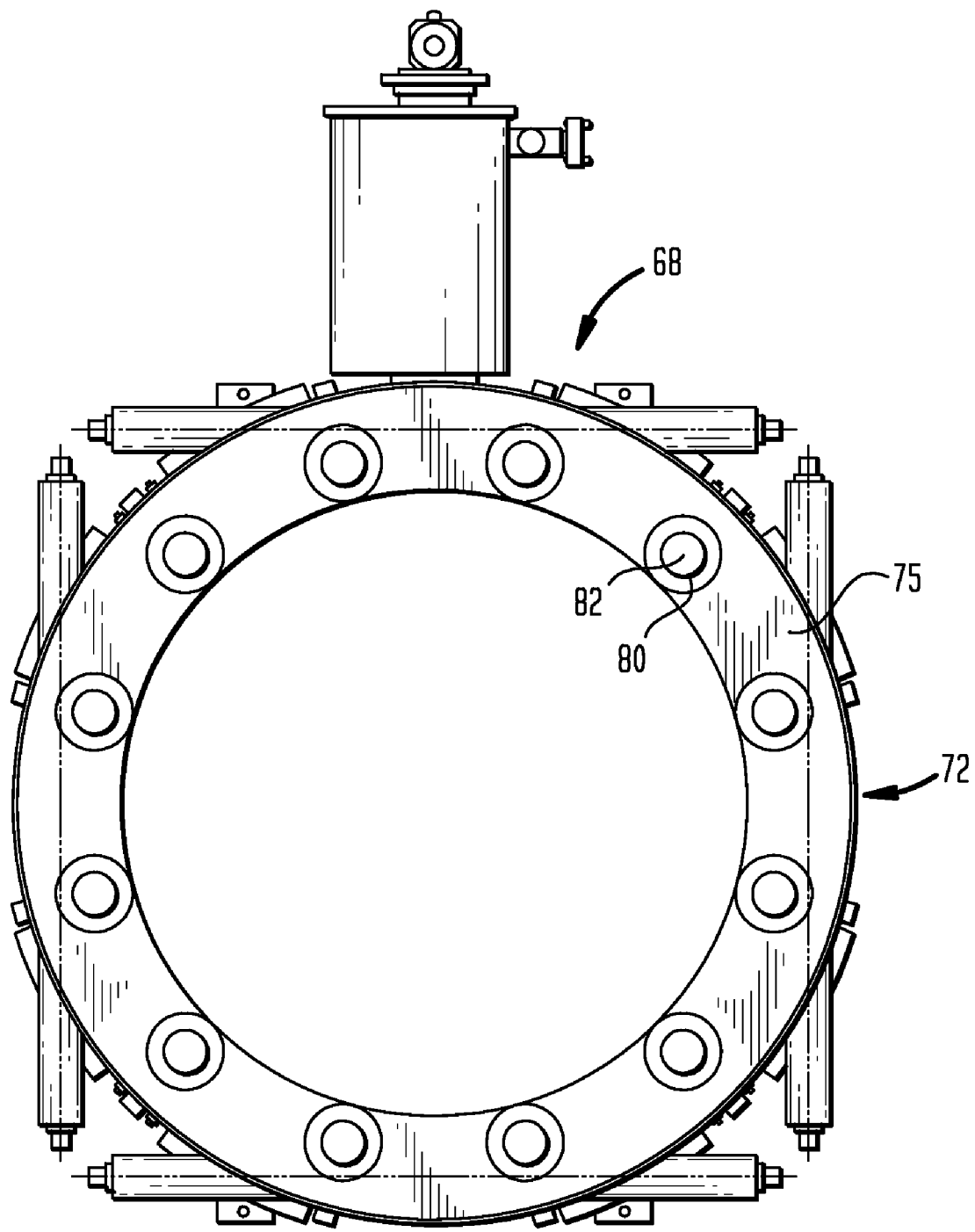

The magnet also includes a pair of superconducting coil assemblies 68 and 70 (FIGS. 1 and 3) generally overlying the inner faces 36 and 40 of side walls 24 and 22. As best seen in FIG. 4, coil unit 68 includes a generally toroidal vacuum vessel 72 having a major axis 79. Vessel 72 has an inner cylindrical wall 73, an outer cylindrical wall 74, inner end walls 75, and outer end wall 77 extending in a radial direction between the inner and outer circumferential walls, so that the vessel defines a hollow space 81 (FIG. 7) of generally rectangular cross-section extending circumferentially around axis 79. As further discussed below, when coil unit 68 is assembled to the ferromagnetic frame 20, axis 79 of the coil unit is coincident with the axis 52 of the frame.

Vessel 72 also has a generally cylindrical service port chamber 76 projecting upwardly and generally radially with respect to axis 79 from the outer circumferential wall 74 at the top of the vessel. Service port chamber 76 is also hollow and defines an interior space communicating with the interior space 81 inside the toroidal portion of the vessel.

Vessel 72 also has projections 78 extending from the outer circumferential wall 74 at locations spaced circumferentially around axis 79. Projections 78 extend substantially tangentially with respect to axis 79. The projections are arranged in sets of four. For example, one such set includes projections 78a, 78b, 78c, and 78d. Projections 78a and 78b extend in one circumferential direction whereas projections 78c and 78d extend in the opposite circumferential direction. Projections 78a and 78c are aligned with one another, whereas projections 78b and 78d are aligned with one another as well. However, projections 78b and 78d are offset from projections 78a and 78c in an axial direction, i.e., the direction parallel to axis 79. The other sets of projections are arranged similarly. Projections 78 are also hollow and communicate with the main interior space within the toroidal portion of the vessel.

Four sets of projections 78 are provided. As mentioned above, projections 78a-78d are located at the top of the toroidal enclosure and extend generally horizontally. A further set 78e is located on the bottom of the vessel, and these projections also extend generally horizontally. Another set including projections 78f is located on one side of the vessel, and these projections extend generally vertically. Projections 78g of the fourth set are located on the other side of the vessel and also extend generally vertically.

The vessel further includes extensions 80 which project generally axially from the outer end wall 75 of the vessel. Extensions 80 are also hollow and communicate with the interior of the vessel. Each extension 80 has an end wall 82 remote from the end wall 75.

Figure 7:
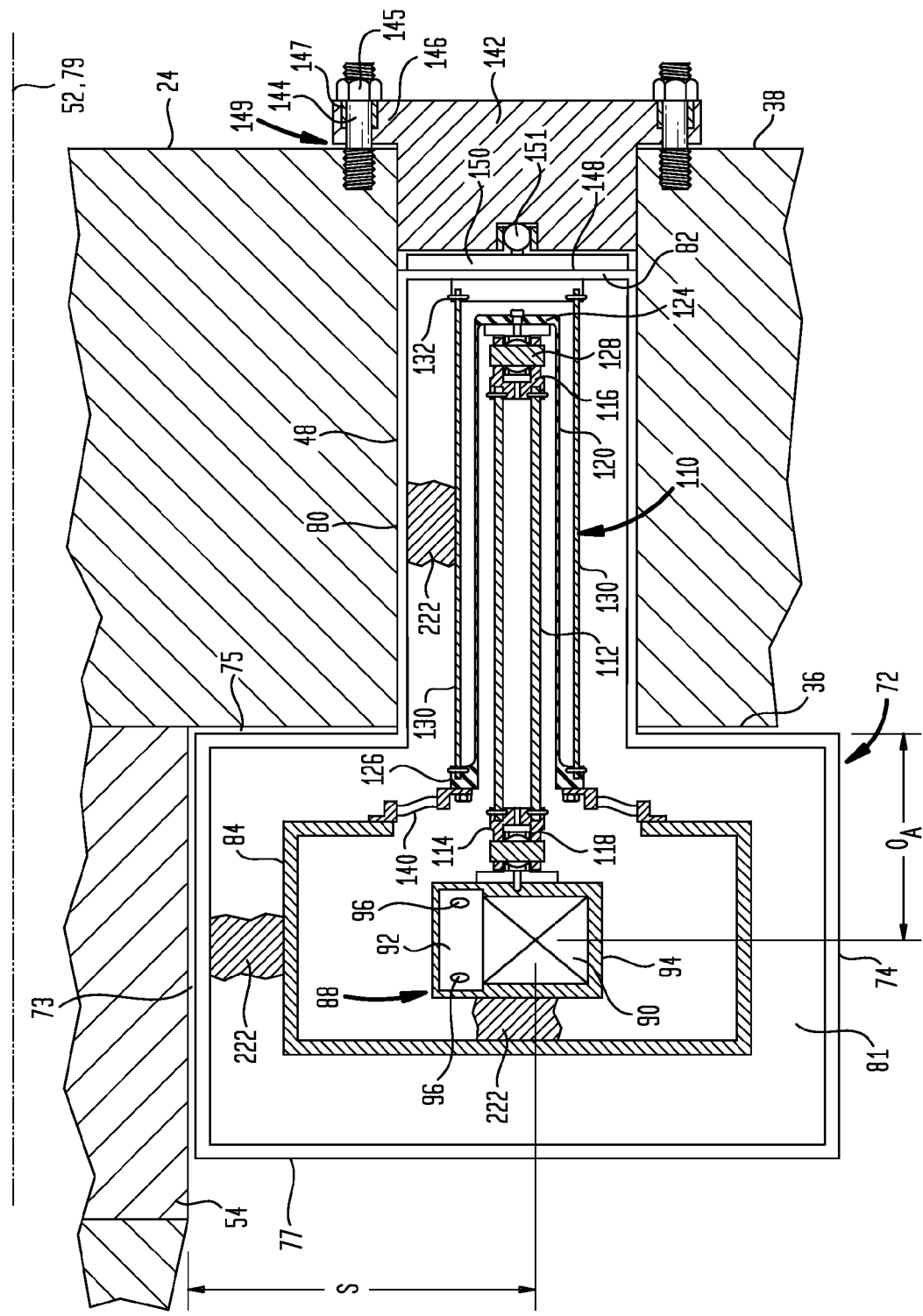
FIG. 7 is a fragmentary, diagrammatic sectional view depicting a portion of the apparatus of FIGS. 1-6.

As best seen in FIGS. 2 and 7, coil unit 68 further includes a toroidal outer heat shield 84 which is enclosed within the toroidal space defined by vessel 72. Heat shield 84 is substantially concentric with the toroidal vessel and central axis 79. Heat shield 84 also has a service port extension 86 (FIG. 2) extending upwardly within the service port chamber 76 of vessel 72. Heat shield 84 and extension 86 desirably are formed from a thermally conductive metallic material as, for example, copper or aluminum.

As also shown in FIGS. 2 and 7, a generally hoop-like cold assembly 88 is disposed within shield 84 and hence within vessel 72. Cold assembly 88 is substantially concentric with axis 79. Cold assembly 88 includes a coil bobbin 94 in the form of a closed, hollow channel with a generally rectangular cross-section, best seen in FIG. 7. As best seen in FIG. 2, the channel extends around the circumference of the hoop-like cold assembly and around axis 79. Windings 90 (FIG. 7) are disposed inside hollow channel 94 and also extend around axis 79. The bobbin 94 provides structural reinforcement and protection for the coil, and also defines a cryogen space 92. The cold assembly 88 also includes a hollow reservoir extension 98 projecting upwardly inside the service port chamber 86 of shield 84 (FIG. 2) and inside of the service port extension 76 of vessel 72. The interior of reservoir extension 98 is in communication with the cryogen space 92 inside bobbin 94, so that the reservoir extension and bobbin define a unitary coolant reservoir. A pair of precoolant tubes 96 are also provided within cold assembly 88.

Straps 100 (FIGS. 2 and 4) extend within the tangential projections 78 of the vessel and extend through shield 84 to cold assembly 88. Thus, straps 100 are disposed around the circumference of the coil unit. Each strap 100 extends through the center of the associated projection 78 of the vessel, so that the strap is connected to the vessel wall at the outer end of the extension. The connection between each strap and the vessel wall may be made by an adjustable tensioning fixture 102 at the outer end of the extension. The straps are thin, elongated members, and therefore, have very low heat conductance. The straps are maintained in tension so that the straps hold the cold assembly 88 in position in the plane of the toroidal vessel. Stated another way, the straps maintain the cold assembly concentric with the toroidal vessel and concentric with the central axis 79 of the vessel.

As best seen in FIG. 7, an elongated coil support 110 is disposed within each of the support extensions 80 of vessel 72. Each elongated coil support 110 includes an elongated first member 112 which may be formed as a tubular element or as a plurality of rods extending parallel to one another. First member 112 has a coil end 114 and an intermediate support end 116. The coil end is attached to the cold assembly 88 by a pivotal mounting 118. Each elongated coil support 100 also includes a second member 120 in the form of an elongated, generally tubular shell surrounding the first member 112. Second member 120 has a closed outer end 124 and an inner end 126. The outer end 124 of the second member is connected to the intermediate support end 120 of the first member 112 by a further pivotal joint 128. The elongated support 110 also includes a third member 130. Third member 130 may be formed as a tubular element surrounding the second member 120 or as a plurality of elongated rods spaced apart from one another around the outside of tubular second member 120, and extending parallel to one another. Third member 130 has an inner end physically connected to the inner end 126 of the second member, and has an outer end 132 bearing on the end wall 82 of the support extension 80. As discussed above with reference to FIG. 4, each of the support extensions 80 extends generally axially, parallel to the central axis 73 of the coil unit and hence parallel to the axis 52 of the ferromagnetic frame. The first, second, and third members of elongated support 110 extend generally coaxially with the support extension 80, and hence generally parallel to the axis 52. However, the pivotal links allow some movement of the inner end 114 of the first member relative to the outer end 116 of the first member and relative to the second member, in a radial direction R, towards and away from axis 52 by limited tilting of the first member with respect to second member 120. For example, the pivotal joints may allow about 1° of tilting. The amount of tilting should be sufficient to compensate for contraction of the cold assembly 88 as the cold assembly is cooled from room temperature to operating temperature. Flexible, thermally-conductive straps such as woven copper fiber straps 140 extend between the inner end 126 of the second member and thermal shield 84. These straps thus thermally connect the juncture between the inner end 130 of the third member with the second member and the thermal shield.

The ferromagnetic frame includes plugs 142, one plug being associated with each recess 48. As shown in FIG. 7, the plugs associated with side wall 24 are fixed to the side wall by studs 144 and nuts 145 extending through a flange 146 formed integrally with the plug, the studs being threadedly engaged in the side wall. Nuts 145 are provided with jam nuts and lock washers (not shown) to assure that the nuts remain in position during service. The flange overlies the outer surface 38 of the side wall with a small gap 149 as, for example, about 0.25 inches (6 mm), between the flange and the outer surface. Compression springs 147 surrounding the studs urge the plugs inwardly, to the left as seen in FIG. 7, with a preload force which. For example, each plug may be urged inwardly with a force of about 300 pounds. The main portion of the plug projects into the recess 48. The plug includes a swivel plate 150 is mounted by a pivot 151 to the main portion of the plug so that plate 150 can tilt over a small range of angular motion in any direction. A surface 148 of the plug forms an abutment surface extending across the recess 48 and facing generally inwardly, i.e., in the same direction as the inner surface 36 of the side wall, to the left as seen in FIG. 7.

The end wall 82 of each support extension 80 of the vacuum vessel is supported by the abutment surface 148 of the swivel plate 150. Because the swivel plug can tilt, the floor surface 148 will contact the end wall 82 over a wide area despite manufacturing tolerances. The outer end 132 of the third member 130 in the elongated support 110 is supported by the end wall 82 of the extension and thus by the swivel plate and plug. Loads directed axially toward the side wall (to the right in FIG. 7) applied by magnetic forces on the coil in cold assembly 88 are directed through the first member 112, which is in compression, and through the second member 120, which is in tension, and finally through the third member 130 to the outer end 132 of the third member, where they are transferred through the end wall 82, shims 150 and floor surface 148 to the plugs and hence to the frame side wall 24.

As further discussed below, the coil within cold assembly as is substantially attracted to the side wall 24 during operation and therefore substantial loads must be transferred in this manner. The numerous elongated connectors 110, each having the elements discussed above, can cooperatively transfer the loads. However, the elongated connectors also serve to substantially minimize heat transfer into the cold assembly 88. During operation, the walls of the vacuum vessel 72, including end walls 82 of the support extensions, are at substantially room temperature inasmuch as these elements are in contact with the frame and otherwise exposed to the ambient environment. However, heat passing from the outer end 132 of the third member must first be conducted along the long, thin elements of the third member 130, and then conducted back down the second member 124 to the outer end 124 of the second member, and finally must be conducted along the long, thin elements of the first member 112 before reaching the cold assembly 88. This tortuous path of elongated members provides an extremely high resistance to heat conduction while still providing the requisite structural integrity. Additionally, the thermal connection through straps 140 between the inner end 126 of the second member and the shield 84 maintains the temperature of the inner end of the second member at approximately the temperature of the shield. Stated another way, heat being conducted along the third member 130 is effectively diverted into the thermal shield 84. As further discussed below, the cryocooler associated with the unit abstracts heat from the thermal shield 84 at a temperature higher than the temperature of the cold assembly 88. Because the cryocooler has a greater cooling capacity at the higher temperature of shield 84, it is advantageous to divert heat into the shield.

Figure 8:
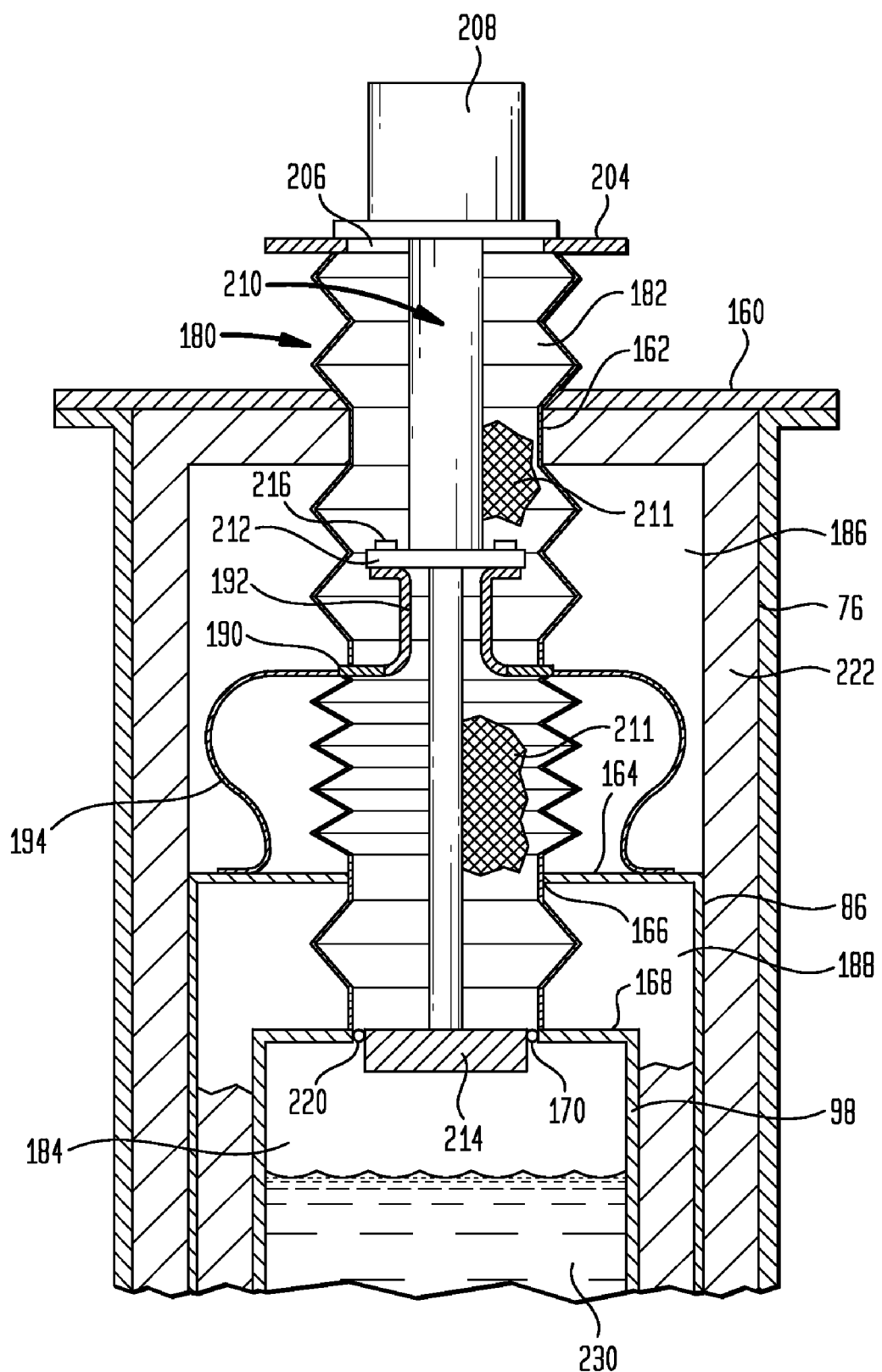
FIG. 8 is a fragmentary, diagrammatic sectional view depicting a further portion of the apparatus shown in FIGS. 1-7.

The service port chamber 76 and associated components are shown in greater detail in FIG. 8. As discussed above, the service port extension 86 of the shield extends within the service port chamber 76, and the reservoir extension 98 of the cold assembly extends within the service port extension 86 of the shield. Service port chamber 76 has a top end wall 160 with a central opening 162. The service port extension 86 of the shield has a top wall 164 with an opening 166 aligned with the opening 162. Also, the reservoir 98 has a top wall 168 with an opening 170 therein, opening 170 being aligned with the openings 166 and 162.

A bellows assembly 180 extends through openings 162 and 166, and extends to the top wall 168 of reservoir 98. The bellows assembly is sealingly connected to the top wall 160 of the service port chamber 76 and to the top wall 168 of reservoir chamber 98, and is also fixed to the top wall 164 of the shield 86. The interior space 182 within the bellows communicates with a headspace 184 within reservoir 98. However, the interior space 182 within the bellows does not communicate with the space 186 between the bellows and the service port chamber 76, and does not communicate with space 188 between the bellows and the service port extension 86 of the shield. Bellows assembly 180 includes a thermal conductor 190 extending through the bellows wall. A collar 192 is disposed inside space 182 of the bellows and is in thermal communication with thermal conductor 190. The collar and thermal conductor may be formed integrally with one another from a highly conductive metal such as copper. A flexible thermal conductor 194 extends between thermal conductor 190 and the top wall 164 of the thermal shield service port extension 86. The flexible heat conductor 194 may be formed as a mat or strips of copper fibers.

Figure 1:
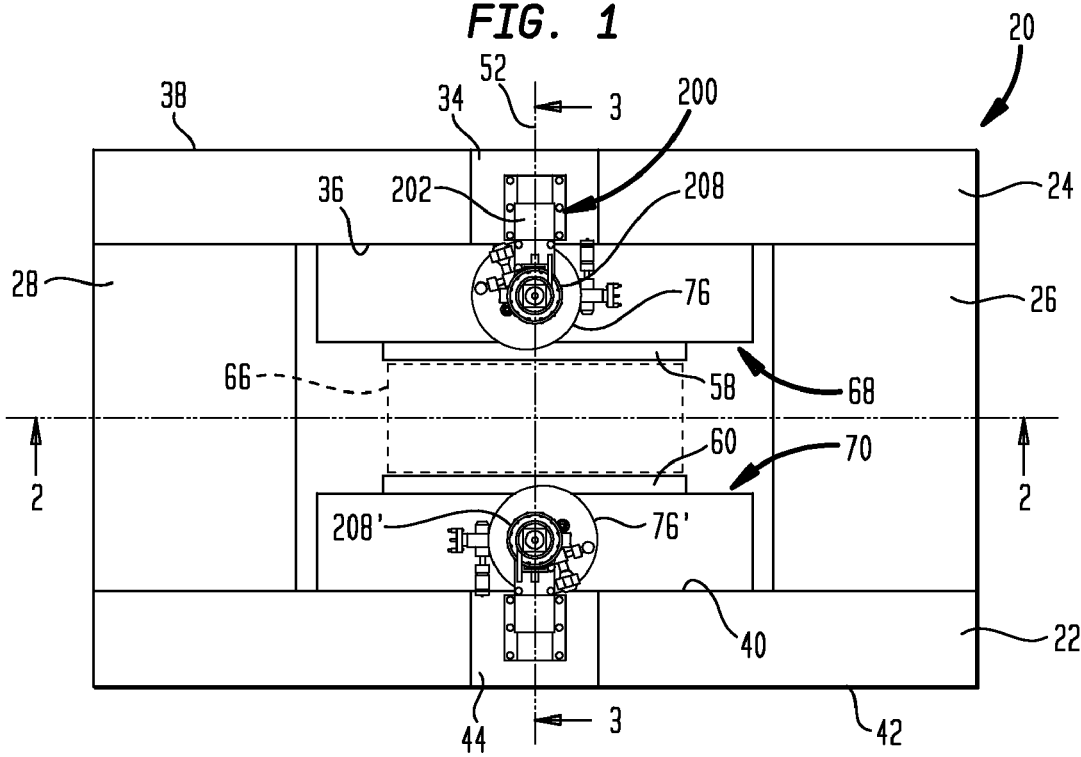
FIG. 1 is a top plan view of a magnet in accordance with one embodiment of the invention.

As best seen in FIGS. 1 and 3, a bracket 200 is mounted within the notch 34 at the top edge of side wall 24 and mechanically connected to the side wall. Bracket 200 has a cryocooler support plate 202 projecting above the top wall 160 of the service port chamber 76 (FIG. 8). The cryocooler support plate 204 has an opening 206 generally aligned with the opening 162 in the service port top wall 160. Bellows 180 projects above the service port top wall 160 to the cryocooler support plate 204.

A cryocooler 208 is mounted on support plate 204 and physically supported by this plate, and hence by bracket 200 and frame side wall 24. The cryocooler may be a unit of the type sold under the designation SRDK415DA by the Sumitomo Company. The cryocooler includes an elongated stem 210 which projects through opening 206 of the support plate and projects downwardly into the space 182 within bellows 180. The cryocooler further includes a high-temperature heat extraction element in the form of a flange 212 mounted on the stem, and a low-temperature heat extraction element 214 at the end of the stem. The cryocooler is arranged to abstract heat applied to high-temperature heat extraction element 212 at a relatively high temperature as, for example, about 40-70° Kelvin and can abstract a substantial amount of heat as, for example, about 20 to about 60 watts while maintaining high-temperature heat extraction element 212 at these temperatures. The cryocooler is also arranged to abstract heat through low-temperature heat extraction element 214 at a temperature corresponding to the boiling point of liquid helium, i.e., about 4.2° Kelvin. However, the cryocooler can only abstract a relatively small amount of heat through the low-temperature heat extraction element 214 while maintaining the low-temperature element at this temperature.

The high-temperature heat extraction element 212 is physically connected to collar 192 of the bellows assembly by bolts 216. Thus, the high-temperature heat extraction element is in thermal communication with the service port extension 86 of the thermal shield through the collar 192, conduction element 190, and flexible thermal conductor 194. The low-temperature heat extraction element 214 sits at the top of the headspace 184 within reservoir 98. A soft, porous O-ring 220 such as a copper mesh O-ring extends between the low-temperature heat extraction element 214 and the top wall 168 of the reservoir, but does not seal opening 170. Therefore, the headspace 184 remains in communication with the space 182 within the bellows, and hence in communication with the ambient outside atmosphere.

As shown in FIG. 8, there are layers of insulation 222 between the service port chamber 76 and the service port extension 86 of the shield, and also between the wall of the service port extension and the wall of reservoir 98. This insulation is depicted schematically. In practice, the insulation is formed from spaced-apart layers of a film which desirably has relatively low thermal conductivity as, for example, metalized layers of polymeric film. Such insulation is commonly referred to as "superinsulation." During operation, as discussed below, the entire space within the vacuum vessel 72—including the space within the service port chamber 76 and the service port extension 86 of the shield, but excluding the headspace 184 within the reservoir 98 and the space 182 within bellows assembly 180—is maintained under a hard vacuum. In this vacuum environment, the predominant mode of heat transfer between the walls of the vessel, the shield, and the reservoir is radiation. The reflective films effectively block such radiation. Additional superinsulation 222 is provided between the walls of the toroidal portion 72 of the vessel and shield 84 (FIG. 7), and also between the shield and the cold assembly 88. Additional superinsulation may be provided around the elongated support 110. Only portions of this superinsulation are depicted for clarity of illustration. Additionally, projections 78 may be provided with superinsulation (not shown) disposed around the straps 100 (FIG. 4).

Further insulation 211 is provided around the stem 210 of the cryocooler 208. This further insulation 211 may be in the form of a porous foam. Insulation 211 is partially omitted in FIGS. 8 and 9 for clarity of illustration. In practice, insulation 211 substantially fills the interior space 182 within the bellows. Insulation 211 substantially blocks radiant heat transfer between the stem of the cryocooler and bellows 180, and substantially blocks convection within the interior space of bellows 182.

The structure of the opposite coil unit 70 (FIGS. 1-3) and associated components is essentially identical to the structure of the coil unit 68 discussed above. For example, the coil unit 70 incorporates a toroidal vessel 72'having a service port chamber 76' (FIG. 3) and support extensions 80' similar to the corresponding components of coil unit 68. Here again, the support extensions 80' are received in recesses 50 in the opposite side wall 22 of the ferromagnetic frame. These recesses are provided with support plugs 142' similar to the plugs 142 discussed above. A cryocooler 208' is associated with coil unit 70 and is carried by a bracket 200' mounted in the notch 44 at the top of side wall 22.

Conventional components such as external power source leads, persistent switches, thermal sensors, liquid-level sensors and emergency rundown heaters may be mounted within service port chambers 76 and 76'. These components may be mounted on the reservoir extension 98 of the cold assembly 88 in coil unit 68, and on the corresponding part in coil unit 70. These components may be of generally conventional construction, and accordingly, are not further described herein.

The magnet structure typically is used in association with gradient field coils (not shown), which are typically mounted on the faces of pole caps 58 and 60. These gradient coils commonly are flat, resistive coil structures which apply minor additional magnetic fields having a known pattern of variation within the patient-receiving space 66 (FIGS. 1 and 3). The magnet is used in conjunction with other conventional structures commonly employed in magnetic resonance imaging apparatus, including an RF antenna and RF transmitting and receiving apparatus, as well as a patient-positioning apparatus for positioning at least a portion of a patient's body within the imaging volume 66 of the static field magnet; and conventional computer apparatus for controlling these components and reconstructing an image from magnetic resonance signals emanating from the patient's body. These components may be, for example, as discussed in the aforementioned U.S. Pat. No. 6,677,753.

The static field magnet desirably is assembled by first assembling the side walls 22 and 24 and some of the flux return members 26-32, and pole stems 54 and 56. (FIGS. 1-3). At this time, however, one or both of the upper flux return members 26 or 28 is omitted, and one or, preferably, both of the pole caps 58 and 60 are omitted. In the next stage of the assembly method, coil unit 68 is installed. Each coil unit is moved into the interior of the frame by first positioning the coil unit in substantially the same orientation as the coil unit will have in the assembled device, with the central axis 79 of the coil unit parallel to the axis 52 of the frame. The coil unit is then maintained in this orientation and advanced into the frame in a lateral direction, transverse to the central axis and transverse to the axis of the frame, until the central axis 79 of the coil unit is aligned with the axis 52 of the frame. In this condition, the central opening of toroidal vessel 72 is aligned with the pole stem 54, and the support extensions 80 are aligned with the recesses 48 in side wall 24. The coil unit is then advanced axially along the pole axis until it reaches its final position, with the toroidal vessel 72 encircling pole stem 54, and with the support extensions disposed in the recesses 48 and bearing on swivel plates 150 as discussed above. Coil unit 70 is assembled to the frame in exactly the same manner. The coil units 68 and 70 may have the cryocoolers 76 and 76' pre-installed thereon and supported on the vacuum vessel 72 or 72' by temporary fasteners (not shown). After placement of the coil units, each cryocooler is physically attached to the bracket as discussed above and the temporary fasteners are removed. Also, after placement of the coil units, the remaining flux return member is installed. After both coil units have been assembled to the frame, the pole caps 58 and 60 are attached to the pole stems. Assembly of the coil units to the frame before final placement of the pole caps allows the coil units to pass into the correct position even though the axial dimension A of each coil unit is larger than the clearance W between the pole caps.

In a variant of the assembly procedure, cryocoolers 208 and 208' are installed after placement of the coil units. Installation and replacement of the cryocoolers is greatly simplified by the design of the bellows 180 and associated components. The collar 192 and thermal conductor 190 may be brought from the operating position shown in FIG. 8 to a retracted position shown in FIG. 9 by lifting the collar upwardly, away from the reservoir 98 and shield service port extension 86. This stretches a portion 180a of the bellows disposed between the thermal connector 190 and the top wall 164 of the shield service port extension, and compresses a portion 180b of the bellows disposed between the thermal connector 190 and the top wall 160 of the service port chamber 76. Also, the flexible thermal conductor 194 is deformed. However, retraction of the collar does not disrupt the seal between the bellows and the other components, and hence, does not open any of the interior evacuated spaces within the vacuum vessel to the atmosphere. With the collar in its retracted position, the cryocooler can be installed, and the high-temperature thermal extraction element 212 can be firmly bolted to the collar using bolts 216. These bolts can be tightened by inserting a tool such as a socket wrench through the opening 206 of the cryocooler support plate 202. Because the high-temperature thermal extraction element can be firmly bolted to the collar, a low-resistance thermal connection can be established. It is not necessary to provide elements such as soft indium-based thermal connections commonly used to mount cryocoolers heretofore, although such materials can be employed if desired.

Figure 9:
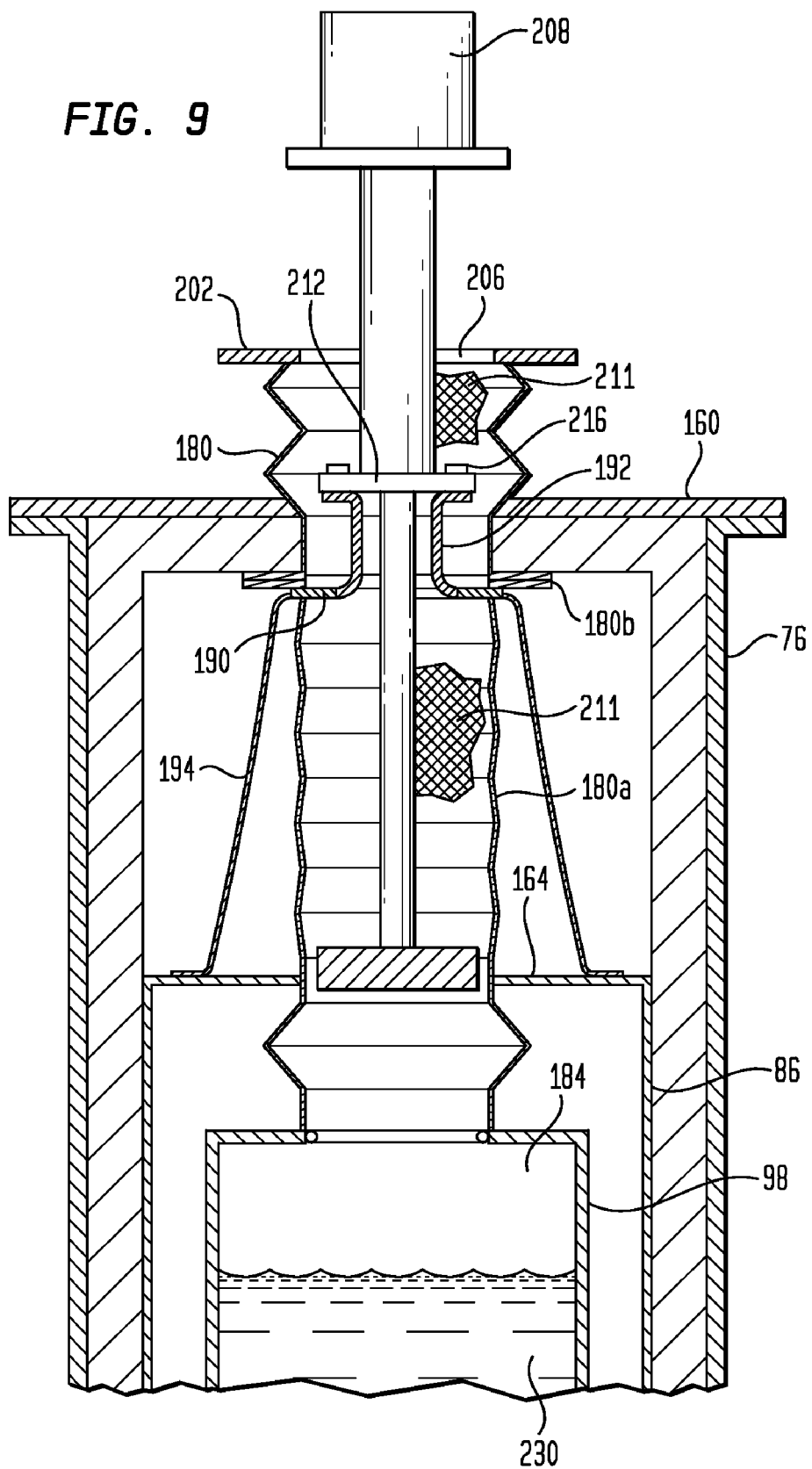
FIG. 9 is a view similar to FIG. 8, but depicting the elements shown in FIG. 8 in a different position.

After installation of the bolts, the cryocooler can be lowered to its normal, operating position (FIG. 8). In this normal operating position, the high-temperature thermal extraction element 212 is deeply recessed within the bellows and inside service port chamber 76. The same cycle of operations can be used to remove and replace the cryocoolers during service. Typically, the cryocoolers must be removed for servicing periodically. The cryocooler mounting as shown in FIGS. 8 and 9 provides significant advantages in ease of maintenance and ease of initial installation, and also provides a reliable thermal connection between the cryocooler and the coil unit.

After assembly, and after evacuating the interiors of vessels 72 and 72', the heat shield and cold assemblies of the coil units are precooled by passing a preliminary coolant such as liquid nitrogen or, preferably, chilled high-purity liquid helium through these elements as, for example, through precoolant tubes 96. The cryocoolers can be started during precooling to speed the precooling process. After precooling, liquid helium is transferred into the reservoir 98 and the coolant passage 92 within the cold assembly of each coil units. The level of liquid helium 230 within reservoir 98 (FIG. 8) is below the top wall 168 of the reservoir and below low-temperature thermal extraction element 214. Once the cold assemblies have reached operating temperature, the persistent switch associated with each coil is brought to a non-superconducting state, and electrical currents are passed through the external current leads and through the coils. The current is gradually increased until the current and the resulting magnetic field reach the desired values and then maintained for a period sufficient to stabilize the field. Once the field has stabilized, the persistent switch is brought to a superconducting state by turning off the heater associated with the persistent switch. Once the switch becomes superconducting, the current flowing in each coil flows through the persistent switch and thus bypasses the external current leads. The currents persist in the coils, inasmuch as the coils have no electrical resistance. The constant, flowing currents create magnetic flux which is directed by the pole stems and pole caps into the patient-receiving space. The flux passing through the patient-receiving space in one axial direction passes through one side wall of the frame, passes back in the opposite axial direction through flux return members 26-21, and passes back through the opposite side wall. The ferromagnetic frame effectively contains all of the return flux, and thus substantially eliminates the hazards associated with fringe fields outside of the frame and the possibility of field disturbances due to magnetic materials disposed outside of the frame.

The cryocoolers are operated to continually abstract heat from the coil units. Most of the heat passing into the coil units through the outer walls of the vessels is conducted by the thermal shield 84 (FIGS. 2 and 7) to the thermal shield extension 86 (FIG. 8) of each coil unit and conducted by the flexible heat conductor 194, conductor 190, and collar 192 to the high-temperature heat extraction element 212 of the cryocooler. The high-temperature heat extraction element desirably is maintained at a temperature of about 40-50° K, so that all portions of the thermal shield 84 are maintained at temperatures of about 70° Kelvin. Therefore, the temperature difference between the thermal shield 84 and the cold assembly 88 is relatively small, and only small amounts of radiant heat enter the cold assembly 88. Heat entering the cold assembly 88 is transferred to the cryogen within the passage 92 (FIG. 7) of the cold assembly 88. The cryogen, in turn, circulates between reservoir 98 and the passage. The cryogen in reservoir 98 is continually boiling so as to form vapor which condenses on the low-temperature heat extraction element 214 (FIG. 8) The condensate drops back into the pool of liquid cryogen 230, so that heat is continually abstracted from the cryogen at the atmospheric pressure boiling point of the cryogen, i.e., about 4.2° Kelvin. Only miniscule amounts of the cryogen vapor escape through the porous O-ring 220.

As the cryocoolers operate, mechanical components within the cryocoolers vibrate. However, vibrations from the cryocoolers are not transmitted to the coil units. Cryocooler 208 is mechanically supported by plate 204 (FIG. 8) and by the bracket 200. The bellows 180 are flexible and do not transmit appreciable vibrations from the cryocooler support plate 204 to the coil unit. The mechanical connection between the high-temperature thermal extraction element 212 and the collar 192 may transmit vibrations to the collar. However, the collar is mechanically isolated from the remainder of the coil unit by the flexible bellows and by the flexible thermal conductor 194. Likewise, the low-temperature thermal extraction element or condenser 214 is mechanically isolated from the surrounding wall 168 of reservoir 98 by the bellows and by the soft, porous O-ring 220. Thus, while each cryocooler 208, 208' is in effective thermal communication with the shield and with the cryogen reservoir of the associated coil unit, the cryocooler is mechanically isolated from the coil unit. Vibrations applied by the cryocoolers to the cryocooler support brackets 200 and 200' (FIG. 3) are effectively damped by the massive ferromagnetic frame or yoke. Therefore, vibrations induced by the cryocoolers do not affect the field provided by the magnet.

The service port chambers 76, 76' and cryocoolers 208, 208' are located in spaces which would normally be waste space within the frame, between the upper flux return members 26 and 28, but offset in the axial direction (the direction of axis 52) from the patient-receiving space 66 of the magnet. As mentioned above, it may be desirable to raise or lower a patient so that a portion of the patient projects above the patient-receiving space and above the pole caps 58 and 60. However, because the service port chambers 76 and 76' and the cryocoolers 208, 208' are axially offset from the patient-receiving space, they do not block such patient elevation. Also, the service port chambers are disposed largely within the height of the frame itself, as are the cryocooler support brackets 200 and 200'.

As best appreciated with reference to FIG. 7, the structure of the coil units and frame provides an efficient mounting for the superconducting coils which promotes co-action between the coils and the frame. The spacing distance S between the center of the windings 90 in cold assembly 88 and the surface of ferromagnetic pole stem 54, in the radial direction transverse to the pole axis, is minimized. The lower limit on this spacing is set by the requirement for thermal insulation between the exterior of the coil unit vessel and the cold unit. All else being equal, greater spacing between the walls of the vessel, such as wall 73 of the vessel, and the shield 84, and greater spacing between the shield 84 and the cold unit 88 provides better thermal insulation, and hence reduces the heat load on the cryocoolers. Thus, this distance will vary with the required operating temperature of the superconducting coils. However, this spacing distance S desirably is about 6 inches (15.2 cm) or less, as, for example, about 5 inches (12.7 cm) or less or about 4.5 inches (11.4 cm) or less. In one exemplary embodiment using niobium-titanium wire coils, which must be maintained at about 4.35° Kelvin or below, the spacing distance S may be about 4.2 inches (10.7 cm).

The coil 90 is also placed close to the interior surface 36 of side wall 24. The axial offset $O_A$ between the center of the coil and the interior surface 36 of the side wall desirably is about 6 inches (15.2 cm) or less, as, for example, about 5 inches (12.7 cm) or less, or about 4 inches (10.2 cm) or less. The arrangement of the elongated supports 110 and the support extensions 80 of the vacuum vessel within the ferromagnetic wall as discussed above facilitates placement of the coil close to the side wall. This arrangement also facilitates construction of the magnet with a reasonable distance between the ferromagnetic walls 22 and 24 while still allowing adequate space for the width W (FIG. 3) of the imaging region. For example, the distance $D_W$ between the inner faces 36 and 40 of the walls may be about 65 inches or less while still maintaining a width W of the patient receiving space between the pole caps of 15 inches (38.1 cm) or more, and desirably about 22 inches (55.9 cm). Typically, the width W of the patient-receiving space defined by the ferromagnetic frame between the pole caps is made larger than the required available width of the patient-receiving space. Components such as gradient coils (not shown) and covers (not shown) typically overlie the pole caps and consume some of the width between the pole caps, so that the available width will be less than the width between the pole caps. Where a ferromagnetic frame is referred to in this disclosure as having a patient-receiving space with a particular width, such reference should be understood as referring to the dimension of the ferromagnetic frame itself, as opposed to the available width of the patient-receiving space in the complete scanning apparatus. For full-body imaging of an adult human patient, the available width of the patient-receiving space should be at least 12 inches (30.5 cm), more desirably least 15 inches (38.1 cm) or more and most desirably 17 or 18 inches (43.2 or 45.7 cm) or more.

Placement of the coil close to the ferromagnetic frame minimizes the number of ampere turns required in the coil to provide a given field. In the exemplary embodiment discussed above, each coil includes 5000 turns carrying 100 amperes, so as to provide 500 kiloampere turns. This provides a flux of 1.5 Tesla within the imaging region 66. By contrast, a conventional "air core" superconducting magnet arranged to provide an equal field strength would require approximately 6 times as many ampere turns, and also would require a complex coil configuration. Desirably, the magnet is capable of providing a field of about 0.5 T or more, with a field uniformity of 1 part in $10^7$ or better, within a region at least about 25 cm in diameter.

In the embodiments discussed above, the ferromagnetic poles project entirely through the coil units, and include cylindrical portions defined by pole stems 54 and 56 (FIG. 3). However, the features discussed above also can be employed with other configurations. For example, the poles may be tapered over their entire axial extent. In other, less preferred arrangements, the poles may be truncated so that they do not project axially beyond the coil units. Also, while the axis 52 is horizontal in the embodiments discussed above, the axis may be in any orientation relative to gravity as, for example, vertical. For example, the features discussed above may be used in magnets having yokes as disclosed in commonly assigned U.S. Pat. No. 6,014,070, the disclosure of which is incorporated by reference herein. Also, the poles and coil units need not be circular. For example, the poles may be elongated in one direction transverse to the axis, and the toroidal structures of the coil units may also be elongated.

The superconducting coils may be formed from materials such as magnesium diboride which allow operation at temperatures above the temperature of liquid helium.

Numerous variations and combinations of the features discussed above can be utilized without departing from the present invention as defined by the claims. Accordingly, the foregoing description of the preferred embodiments should be taken by way of illustration rather than by way of limitation of the present invention.

The invention claimed is:

1. A superconducting coil unit for a magnet, said coil unit comprising:
   (a) a coil;
   (b) a thermal shield surrounding the coil;
   (c) a vacuum vessel surrounding the coil, said vacuum vessel including a service port wall;
   (d) a hollow tubular element having a wall which is at least partially flexible extending in an inward direction into the vessel from said service port wall to said shield, said hollow tubular element defining an interior space;
   (d) a cryocooler having a first heat extraction element, said first heat extraction element being disposed within said tubular element when said cryocooler is in an operating position;

(e) a thermal conductor extending through the wall of said tubular element, said thermal conductor including an interior portion disposed in said interior space and a flexible exterior portion disposed outside of said tubular element and connected to said shield, said first heat extraction element of said cryocooler being attached to said interior portion of said thermal conductor for heat transfer therebetween, said flexible tubular element and said flexible exterior portion of said thermal conductor permitting movement of said cryocooler outwardly from said operating position to a retracted position.

2. A coil unit as claimed in claim 1 wherein said first heat extraction element is releasably attached to said interior portion of said thermal conductor.

3. A coil unit as claimed in claim 1 wherein said first heat extraction element is bolted to said interior portion of said thermal conductor.

4. A coil unit as claimed in claim 1 further comprising a cryogen reservoir disposed inside said thermal shield, said tubular element extending to said cryogen reservoir so that said interior space of said tubular element communicates with said cryogen reservoir, said cryocooler having a second heat extraction element disposed inward of said first heat extraction element in proximity to the cryogen reservoir.

5. A coil unit as claimed in claim 4 wherein said interior space within said tubular element communicates with the exterior of said vacuum vessel.

6. A coil unit as claimed in claim 4 wherein said cryocooler is not rigidly connected to said vacuum vessel, said shield or said cryogen reservoir.

7. A coil unit as claimed in claim 5 wherein said tubular element extends substantially vertically downwardly from said service port wall.

8. A coil unit as claimed in claim 6 further comprising a bracket supported above said service port wall, said cryocooler being supported by said bracket.

9. A method of assembling a magnetic resonance imaging magnet comprising the steps of:
    (a) providing a ferromagnetic frame defining an axis;
    (b) positioning each one of a pair of generally hoop-like coil units each including a coil and each having a central opening by advancing the coil unit in a lateral direction transverse to the axis until the central opening of the coil unit is aligned with the axis and then moving the coil unit axially; and
    (c) after said positioning step, assembling at least a portion of at least one pole to the frame so as to form poles extending along said axis, each one of the coil units having an axial dimension larger than a clearance between the poles.

10. A method as claimed in claim 9 wherein, prior to said positioning step, said frame includes a pair of ferromagnetic pole stems projecting towards one another along the axis, said pole stems having ends confronting one another, said assembling step including mounting at least one pole cap to at least one of said pole stems.

11. A method as claimed in claim 9 wherein each said coil unit includes a superconducting coil and a generally toroidal vessel surrounding the coil and defining the central opening of the coil unit, said vessel having support extensions extending parallel to one another and transverse to the plane of the toroidal vessel, said frame includes a pair of walls extending transverse to the axis, and said step of moving each said coil unit axially includes engaging said support extensions within recesses in said walls.

12. A method as claimed in claim 9 further comprising the step of assembling at least one flux return member to said walls before positioning said coil units and assembling at least one other flux return member to said side walls after positioning said coil units.

13. A method of assembling a magnetic resonance imaging magnet comprising the steps of:
    (a) positioning a pair of ferromagnetic walls substantially parallel to one another so that inner surfaces of the side walls confront one another; then
    (b) positioning each one of a pair of generally hoop-like coil units each including a coil and each having a central opening by advancing the coil unit in a lateral direction parallel to the inner surfaces of the side walls until the central openings of the coil unit are aligned along an axis extending between the side walls; and
    (c) after said positioning step, assembling at least one ferromagnetic flux return member with the side walls so that such flux return member extends between the side walls,
    wherein each said coil unit includes a superconducting coil and a generally toroidal vessel surrounding the coil and defining the central opening of the coil unit, said vessel having support extensions extending parallel to one another and transverse to the plane of the toroidal vessel, and wherein the step of positioning each coil unit includes moving the coil unit parallel to the axis to engage the support extensions in recesses in the walls.

\* \* \* \* \*

UNITED STATES PATENT AND TRADEMARK OFFICE
CERTIFICATE OF CORRECTION

PATENT NO.        : 8,054,077 B2
APPLICATION NO.   : 12/486147
DATED             : November 8, 2011
INVENTOR(S)       : Hank Hsieh et al.

It is certified that error appears in the above-identified patent and that said Letters Patent is hereby corrected as shown below:

Column 2, line 57, "structures hold" should read -- structures holding --.
Column 7, line 51, "force which." should read -- force. --.
Column 8, line 8, "cold assembly" should read -- cold assembly 88 --.
Column 8, line 9, "as is substantially" should read -- is substantially --.
Column 10, line 59, "28 is omitted" should read -- 28 are omitted --.
Column 11, line 26, "cryocoolers is" should read -- cryocoolers are --.
Column 12, line 5, "coil units" should read -- coil unit --.
Column 13, line 39, "provides better" should read -- provide better --.
Column 13, line 39, "reduces" should read -- reduce --.
Column 13, line 55, "facilitates" should read -- facilitate --.
Column 13, line 62, "patient receiving" should read -- patient-receiving --.

Signed and Sealed this
Nineteenth Day of February, 2013

Teresa Stanek Rea
*Acting Director of the United States Patent and Trademark Office*